United States Patent [19]
Watterman
[11] 4,253,374
[45] Mar. 3, 1981

[54] METHOD AND APPARATUS FOR PIANO TUNING AND TEMPERING

[76] Inventor: Peter C. Watterman, 8 Baron Park La., Apt. 26, Burlington, Mass. 01803

[21] Appl. No.: 967,275

[22] Filed: Dec. 7, 1978

[51] Int. Cl.[3] ........................ G01G 7/02; H03B 21/01; G01R 23/14

[52] U.S. Cl. ................................ 84/455; 84/DIG. 18; 324/79 R

[58] Field of Search ................. 84/454, 455, DIG. 18; 324/78 N, 78 F, 78 Z, 79 R, 81, 77 B, 77 D, 77 E; 330/1, 69; 328/134, 137, 138, 139, 154

[56] References Cited

U.S. PATENT DOCUMENTS

| | | | |
|---|---|---|---|
| 2,919,620 | 1/1960 | Dorf | 84/454 |
| 3,102,928 | 9/1963 | Schroeder | 324/77 E |
| 3,968,430 | 7/1976 | Maas | 324/77 E |
| 3,968,719 | 7/1976 | Sanderson | 84/454 |
| 4,163,408 | 8/1979 | Capano | 84/454 |

*Primary Examiner*—L. T. Hix
*Assistant Examiner*—S. D. Schreyer
*Attorney, Agent, or Firm*—Weingarten, Maxham & Schurgin

[57] ABSTRACT

The invention comprises a method and apparatus for the tuning of a piano and other similar musical instruments to equal temperament. A transducer is operative to receive two notes being struck, one of which is tuned and the other of which is to be tuned. The electrical output signal provided by the transducer is processed by bandpass filtering to isolate a predetermined beat note which is associated with the two notes being struck. The filter output signal is applied to an output transducer such as headphones which provides an audible rendition of essentially only the intended beat note.

18 Claims, 5 Drawing Figures

METHOD AND APPARATUS FOR PIANO TUNING AND TEMPERING

FIELD OF THE INVENTION

This invention relates to the tuning of musical instruments and more particularly to a method and apparatus for tuning of pianos and other similar instruments to equal temperament.

BACKGROUND OF THE INVENTION

In order to properly tune a piano according to the equally tempered scale, the notes are tuned such that the frequency ratio for each half step is constant at a value of $2^{1/12}$ which is equal to 1.059463. By standard and well established tuning procedure, the notes are tuned by listening to beats between an overtone of the note being tuned and an overtone of a selected note already tuned, and adjusting the string tension of the note being tuned to attain the intended beat rate. An exposition of standard piano tuning procedure is given in "Piano Servicing, Tuning and Rebuilding", Arthur A. Reblitz, Vestal Press, Vestal, N.Y., 1976, and "Piano Tuning, Repair and Rebuilding", Floyd A. Stevens, Nelson Hall Company, Chicago, Ill., 1972, reprinted 1977. This standard tuning procedure relies upon the practice and skill of the tuner in laying the temperament of at least one full octave, and then tuning the remainder of the keyboard in relation to the properly tempered octave. The intended beat note associated with the two struck notes is produced by overtones of the struck notes which are of lesser intensity than the fundamental tones and which may be masked by spurious beats and ambient noise. As a result, the desired beat note is often difficult to hear, especially without practice and skill.

Electronic tuning aids have been proposed heretofore, and have been based on a comparison of the pitch of a reference note provided by the tuning apparatus and that of a single note being tuned, and nulling of beats between the first harmonic (fundamental) of the notes being compared to thereby tune a note to the reference pitch. Examples of such tuning aids and described in U.S. Pat. Nos. 3,585,898; 3,766,818; 3,901,120 and 4,088,052. However, a piano cannot be tuned by pitch alone to achieve a musically satisfactory scale. A difficulty in tuning a piano by comparison of pitch between a note being tuned and a reference note is caused by the characteristic known as "stretch", caused by the finite, non-zero string diameter, and the stiffness of the strings, in which the overtones actually sounded by a piano string will occur at slightly higher frequencies than the mathematically specified harmonics. The effect of stretch tends to be greatest in spinet models which employ shorter string lengths than console or grand models. Thus, the harmonic frequencies specified for notes of a piano are somewhat idealized since in practice the scale must be stretched over its entire range in accordance with the characteristics of the particular piano. Since the desired frequencies of all of the keys are not known a priori, because of the stretch characteristics of the particular piano, the instrument cannot be readily tuned by pitch alone. The instrument can be recalibrated for each note tuned after the temperament of an octave is completed, but this procedure is very tedious. A technique is described in U.S. Pat. No. 3,968,719 in which a stretch correction is provided for the particular instrument, and the corrections then employed to calibrate a series of frequency tone generators and thereafter using the calibrated tone generators for adjustment of the pitch of the piano notes.

SUMMARY OF THE INVENTION

In brief, the present invention provides a method and apparatus for the isolation of a predetermined beat note for each note being tuned and which is simply implemented and operative in accordance with accepted tuning procedure. A transducer such as a microphone or electromagnetic pickup, is disposed in or near the piano at a position to receive two notes being struck, one of which is tuned and the other of which is to be tuned. The electrical output signal provided by the transducer is processed by a bandpass filter having a center frequency at the frequency of the intended beat note which is associated with the two notes being struck. The filter is operative to exclude both the fundamentals and the unwanted overtones which are not of interest for the particular note being tuned, and to pass essentially only the frequency spectrum associated with the intended beat note. The filter output signal is applied to a transducer such as a pair of headphones which provides an audible rendition of the intended beat note for use by the tuner in adjusting the string tension of the note being tuned to achieve a desired beat rate.

The filter can be either active or passive and can be either tunable or of fixed filter characteristics. In one implementation of the invention, a single tunable filter can be employed having controls for adjustment of center frequency and bandwidth. Alternatively, a bank of fixed filters can be employed, each associated with a respective note to be tuned. The frequency range of the filter apparatus can cover the number of notes to be tempered, and can span one octave or more up to and including the entire keyboard.

The invention is useful for other than the tuning of a piano and can be employed for other musical instruments in which a series of harmonics or overtones is available to produce a beat note for tuning as in the standard piano tuning procedure. For example, a harpsichord can be tuned by use of the invention, as can electric pianos such as the Wurlitzer and Rhodes pianos which respectively employ tuned reeds and tuning forks as sound generators.

DESCRIPTION OF THE DRAWINGS

The invention will be more fully understood from the following detailed description taken in conjunction with the accompanying drawings, in which.

DETAILED DESCRIPTION OF THE INVENTION

The invention can be employed in accordance with standard piano tuning procedure which is well accepted and by which a suitably tuned and tempered instrument can be achieved. The tuning procedure is outlined below, and in the following discussion, the keyboard is conventionally notated by letter name and key number. Thus, the lowest bass note is designated A1, and the highest note on the standard piano keyboard is designated C88.

Figure 1:
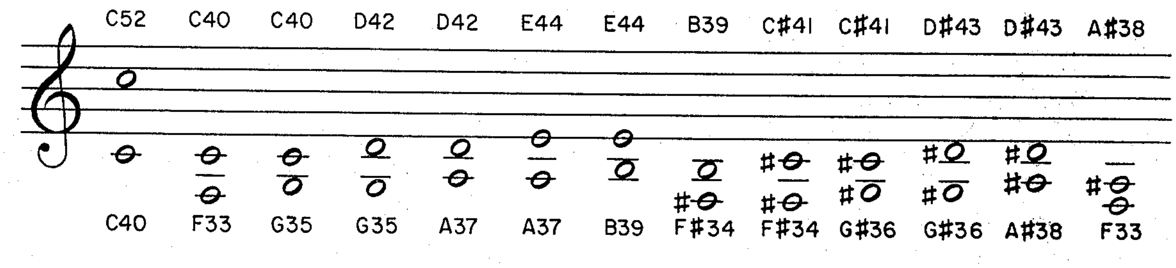
FIG. 1 shows, in musical notation, the notes of a tuning chain which can be employed in practice of the invention.

In Table I there is shown the tuning chain for laying the temperament from F33 to E44. The tuning chain is also shown in musical notation in FIG. 1. The left-hand column of the table shows the keys which are struck and which include the note being tuned, delineated by underlining, and the pretuned note which is struck to produce the beats. The beat note is shown in the center column in terms of its nominal frequency and note identification. The right-hand column sets forth the desired beat rate, which is defined as the number of beats occurring in a five second interval.

TABLE I

| Keys struck | Beat note (Hz) | Beat rate (beats per 5 sec.) |
|---|---|---|
| C52 (with tuning fork) | 523.252 (C52) | 0 |
| C40- C52 | 523.252 (C52) | 0 |
| F33- C40 | 523.252 (C52) | 2.95 |
| G35- C40 | 783.992 (G59) | 4.43 |
| G35- D42 | 587.330 (D54) | 3.32 |
| A37- D42 | 880.000 (A61) | 4.98 |
| A37- E44 | 659.256 (E56) | 3.72 |
| B39- E44 | 987.768 (B63) | 5.58 |
| F#34- B39 | 739.988 (F#58) | 4.19 |
| F#34- C#41 | 554.366 (C#53) | 3.12 |
| G#36- C#41 | 830.608 (G#60) | 4.71 |
| G#36- D#43 | 622.254 (D#55) | 3.51 |
| A#38- D#43 | 932.328 (A#62) | 5.27 |
| F33- A#38 (test) | 698.456 (F57) | 3.95 |

The tuner begins by muting all but the center string of each unison, using a felt muting strip, and then tunes to concert pitch the note C52, which is the C above middle C, using a tuning fork tuned to the accepted pitch of 523.3 Hz. The string tension of this note is adjusted until there are no perceptable beats between the note being struck and the simultaneously sounding tuning fork note. The middle C, C40, is then tuned in relation to the now tuned note C52 by adjusting the octave interval so that the interval is beatless. Tuning of these notes is relatively easy since they are tuned beatless and since they involve only the fundamentals or second overtones and are therefore of relatively high intensity. The tuner next proceeds to lay the temperament of at least one full octave to achieve an equally tempered scale wherein the frequency ratio between each half step is constant. Since the octave spans a factor of two in frequency and consists of twelve half steps, the desired frequency ratio for each half step is $2^{1/12}$ or 1.059463. The temperament is established by employing intervals of fourths or fifths, the fourths being expanded from resonance to slightly stretch the interval, while the fifths are compressed from resonance to slightly diminish the interval. A tuning chain of fourths and fifths is sequentially employed, and for each interval of the chain, the note being tuned is adjusted to achieve an intended beat rate for the predetermined beat note for the interval which is struck.

After establishing the tuning and temperament of at least one full octave, the remaining notes above and below the temperament octave are tuned by employing octave intervals and tuning of each new note to be beatless. The muting strip is thereafter removed from one string at a time and each such string is tuned beatless with the string of the associated unison which has already been tuned.

Figure 2A:
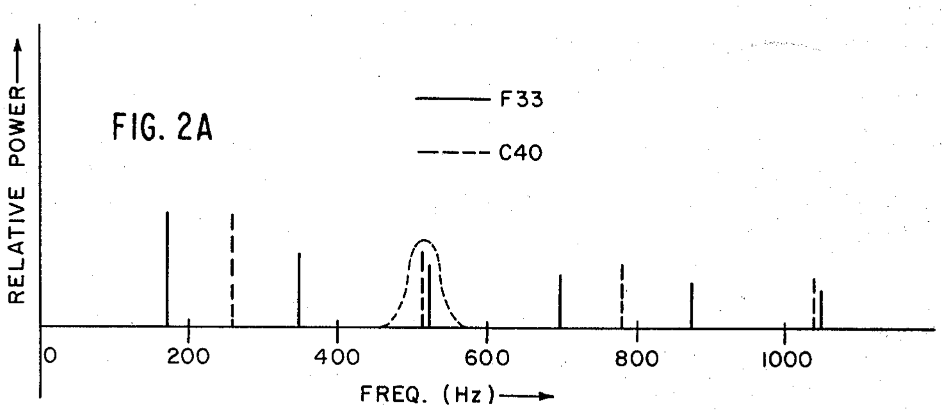
FIGS. 2A and 2B are spectral diagrams of the overtones of a fifth and a fourth, respectively, and which are useful in illustrating operation of the invention.
Figure 2B:
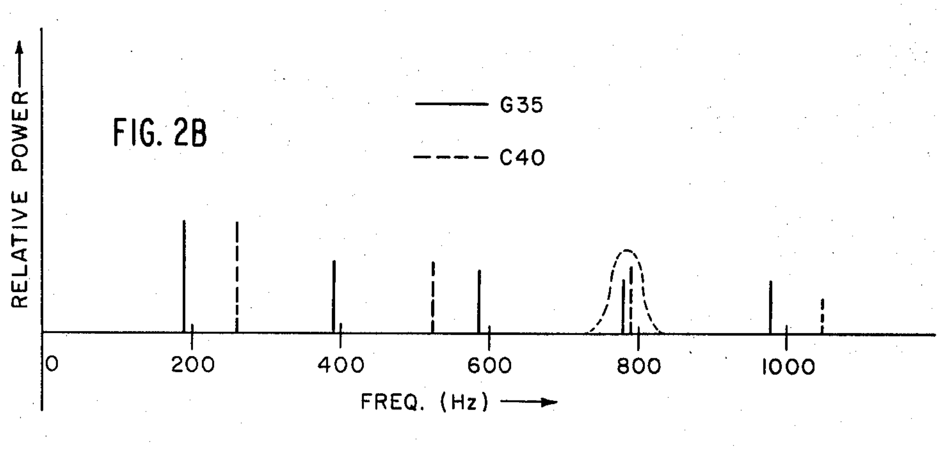

The purpose of the invention is to isolate the intended beat note from an associated complex of tones and spurious beats and to audibly reproduce only the desired beat note as an aid for the individual tuning the instrument. To illustrate the harmonic makeup of the notes of an equally tempered scale, the first six harmonics of the notes F33, G35 and C40 are set forth in Table II. The spectral diagram of FIG. 2A shows the harmonics of F33 and C40, while the spectral diagram of FIG. 2B shows the harmonics of G35 and C40. The dotted envelopes illustrated in FIGS. 2A and 2B are of the filter for isolation of the intended beat notes.

TABLE II

| Harmonic | F33 | G35 | C40 |
|---|---|---|---|
| 1st (fund.) | 174.614 Hz | 195.998 Hz | 261.626 Hz |
| 2nd | 349.228 | 391.996 | 523.252 |
| 3rd | 523.842 | 587.994 | 784.878 |
| 4th | 698.456 | 783.992 | 1046.504 |
| 5th | 873.070 | 979.990 | 1308.130 |
| 6th | 1047.684 | 1175.998 | 1569.756 |

Except in the lowest bass range of the keyboard, each higher order harmonic has progressively less intensity. It is seen that the third harmonic of F33 is nearly the same frequency as the second harmonic of C40, and it is these harmonics which produce the intended beat note for this interval (FIG. 2A). The sixth harmonic of F33 is also nearly the same frequency as the fourth harmonic of C40, and as a result, a second beat note is present when the notes F33 and C40 are struck. This higher frequency pair of harmonics causes beats which occur at twice the rate of the intended beat note and which can confuse the perception of the intended beat note. The perception of the intended beat note is also difficult because of the presence of louder fundamental tones and other harmonics, some of which can be louder than the desired beat note. Spurious beat notes can also be produced from a single string which is defective.

For the interval of G35 and C40, near coincidence occurs for the fourth harmonic of G35 and the third harmonic of C40 (FIG. 2B). This beat note is more difficult to hear than that of the interval F33 and C40, since the beats are produced by higher harmonics which are of lesser intensities. Similar harmonic relationships exist for each interval of the tuning chain, wherein a desired beat note is present along with spurious beat notes and higher intensity tones. In accordance with the invention, substantially all unwanted frequencies produced by the pair of notes of the tuning chain are removed, and only the spectrum centered about the intended beat note is reproduced and rendered audible.

Figure 3:
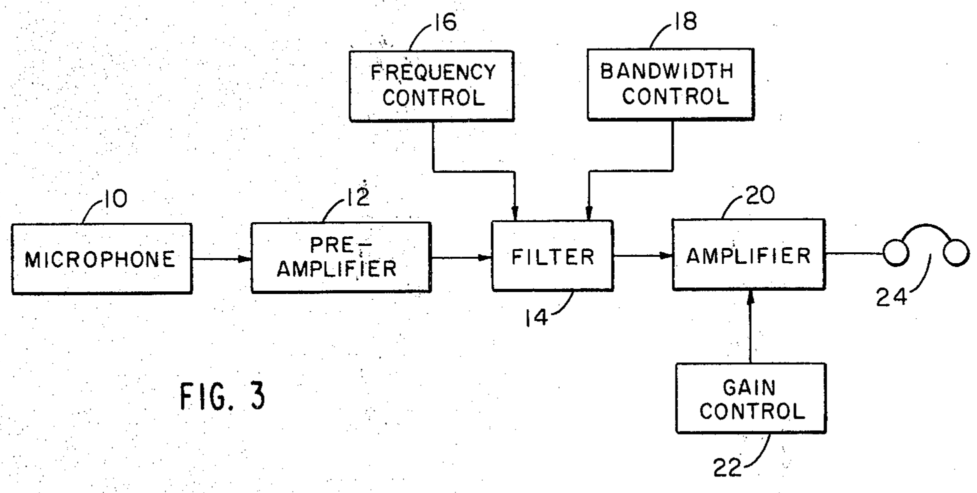
FIG. 3 is a block diagram of piano tuning apparatus in accordance with the invention.

The invention can be implemented as shown in FIG. 3. Referring to FIG. 3 there is shown a microphone 10 having its output coupled to a preamplifier 12, the output of which is coupled to a filter 14 which includes a frequency control 16 and a bandwidth control 18. The output signal from the filter is applied to an amplifier 20 which includes a gain control 22 and the output of which is applied to earphones 24 or other output transducer. The filter 14 is one preferred embodiment is an active bandpass filter which is tunable over a frequency range encompassing the keys or notes to be tuned. The frequency range can be such to include only a single octave which is to be tempered, or can be made to accommodate more than one octave and even the entire keyboard range. The filter bandwidth should be sufficiently narrow to exclude the unwanted harmonics or overtones as perceived by the listener. A bandwidth in the range of a fraction of one percent to a few percent, as measured to the half-power points, is adequate to remove all unwanted tones. As an example, a bandwidth of 0.113% can be employed for both fourths and fifths of the tuning chain. The bandwidth should be approximately symmetric about the center frequency. In addition, the frequency response should drop or roll off from the half-power points at a rapid rate, say 24 db per octave. The filter bandwidth should be sufficiently wide to pass both of the intended overtones which produce the beat rate of interest. The intended overtones may be translated in frequency due to stretching, therefore the filter bandwidth should be sufficiently wide to accommodate both stretched overtones, or the filter should be tunable to the center frequency of the stretched overtones. The bandwidth should, preferably, be wide enough or the center frequency tunable to accommodate for variation in the "concert" pitch being employed for the particular instrument. Such an active bandpass filter can be implemented in any manner well known in the art of filter design. A commercially available active bandpass filter which can be employed in practice of the invention is the Model 3800 Tracking Filter manufactured by Krohn-Hite Corporation, Avon, Mass.

It will be appreciated that the preamplifier 12 may or may not be necessary depending upon the signal level from microphone 10 and the input signal sensitivity of filter 14. Similarly, the requirement for amplifier 20 will depend upon the signal levels needed to drive the headphones 24 at a comfortable listening level. The active filter may itself include the necessary amplification such that either or both of amplifiers 12 and 20 can in practice be part of the filter 14. The input transducer can be other than a microphone and can also be for example, an electromagnetic transducer operative to sense the vibrations of the strings which are struck. Such transducers are per se well known. The output transducer is preferably a headphone to shield direct sound and noise and only reproduce the intended beat note. The headphone can be single or a pair, or of the earplug type. A loudspeaker can alternately be employed.

Figure 4:
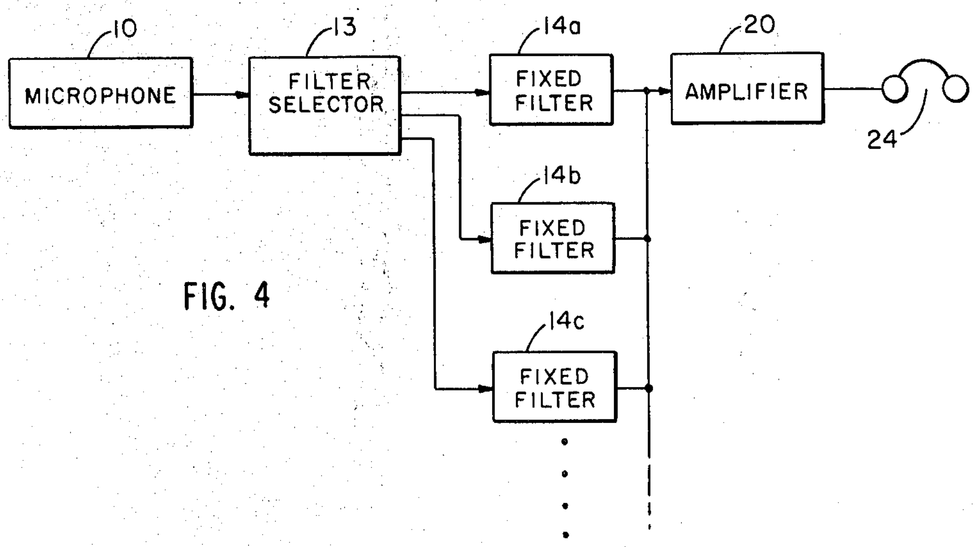
FIG. 4 is a block diagram of an alternative embodiment of piano tuning apparatus according to the invention.

An alternative embodiment of the invention is shown in FIG. 4 and includes a microphone 10 coupled to a filter selector 13 which, in turn, is coupled to a plurality of fixed filters 14*a* through 14*c*, etc. The filter outputs are coupled to the input of an amplifier 20, the output of which is applied to headphones 24. Each fixed filter is of predetermined non-tunable characteristics having a selected center frequency and bandwidth, and each fixed filter is associated with a corresponding note which is to be tuned. The number of fixed filters provided will depend upon the frequency range to be covered. As stated above, it may be desirable to providing tuning apparatus for only a single octave for which the temperament is to be established. Alternatively, more than one octave can be covered by a correspondingly greater number of filters, or a filter can be provided for each note of the keyboard to thereby accommodate the entire keyboard or frequency range of the piano or other instrument being tuned.

The frequency range of the piano keyboard extends from about 27.5 Hz to 4,186 Hz. The frequency range of the required beat notes for the octave F33 to F45 is about 523.3 Hz to 987.8 Hz. The ranges, or any intermediate range can be readily accommodated by either a tunable filter or an array of fixed filters.

Various modifications and alternative implementations will occur to those versed in the art without departing from the spirit and true scope of the invention. Accordingly, the invention is not to be limited by what has been particularly shown and described except as indicated in the appended claims.

What is claimed is:

1. For use in tuning a musical instrument wherein two notes of a tuning chain are sounded, one of which is already tuned and the other of which is to be tuned, these notes being of predetermined musical interval and each note having overtones which interact with the overtones of the other note, and beat notes produced by predetermined overtones of the two sounded notes, one of these beat notes being the intended beat note for the particular two notes which are sounded, apparatus comprising:

a first transducer for receiving the two notes being sounded including their fundamental tones, overtones and beat notes produced by the overtones, and providing an electrical signal representative thereof;

filter means operative in response to the electrical signal to pass essentially only the intended beat note produced by predetermined overtones of the associated two sounded notes, and to exclude the fundamentals, other overtones and spurious beat notes produced by the sounded notes, said filter means providing a filter output signal representing essentially only the intended beat note; and a second transducer operative in response to the filter output signal to provide an audible rendition of essentially only the intended beat note for audible reception to permit adjustment of the rate of the intended beat note and thereby adjust the note being tuned.

2. The apparatus of claim 1 wherein said filter means has a bandwidth sufficiently narrow to exclude unwanted overtones as perceived by a listener and sufficiently wide to pass both of the intended overtones which produce the intended beat note.

3. The apparatus of claim 2 wherein said filter means has a bandwidth in the range of fractions of one percent to a few percent, as measured at the half-power points.

4. The apparatus of claim 3 wherein said filter means has a rapid roll-off from the half-power points of about 24 db per octave.

5. The apparatus of claim 1 wherein said filter means includes a tunable filter capable of adjustment to the center frequency of each intended beat note.

6. The apparatus of claim 1 wherein said filter means includes a plurality of fixed filters, each associated with a respective note to be tuned and each having a predetermined center frequency and bandwidth.

7. The apparatus of claim 1 wherein said filter means includes means for adjusting the amplitude of the signal applied thereto and the amplitude of the intended beat note signal.

8. The apparatus of claim 1 wherein said first transducer is a microphone.

9. The apparatus of claim 1 wherein said first transducer is an electromagnetic pickup.

10. The apparatus of claim 1 wherein said second transducer is a pair of headphones.

11. The apparatus of claim 1 wherein said second transducer is a headphone.

12. The apparatus of claim 1 wherein said second transducer is a loudspeaker.

13. The apparatus of claim 1 wherein said filter means includes an active bandpass filter having a center frequency and bandwidth corresponding to the note to be tuned.

14. The apparatus of claim 1 wherein said filter means is an active bandpass filter tunable to a different center frequency for each note to be tuned.

15. The apparatus of claim 14 wherein said filter means includes means for adjusting the center frequency and bandwidth of the filter.

16. For use in tuning a piano wherein two notes of a tuning chain are struck, one of which is already tuned and the other of which is to be tuned, these notes being of predetermined musical interval and each note having overtones which interact with the overtones of the other note, and beat notes produced by predetermined overtones of the two struck notes, one of these beat notes being the intended beat note for the particular two notes which are struck, apparatus comprising:

a first transducer for receiving the two notes being struck including their fundamental tones, overtones and beat notes produced by the overtones, and providing an electrical signal representative thereof;

filter means operative in response to the electrical signal to pass essentially only the intended beat note produced by predetermined overtones of the associated struck notes, and to exclude the fundamentals, other overtones and spurious beat notes produced by the struck notes, said filter means providing a filter output signal representing essentially only the intended beat note; and a second transducer operative in response to the filter output signal to provide an audible rendition of essentially only the intended beat note for audible reception to permit adjustment of the rate of the intended beat note and thereby adjust the note being tuned.

17. The method of claim 16 further including:

repeating the foregoing steps for each pair of notes of a tuning chain.

18. For use in tuning a musical instrument wherein two notes of a tuning chain are sounded, one of which is already tuned and the other of which is to be tuned, these notes being of predetermined musical interval and each note having overtones which interact with the overtones of the other note, and beat notes produced by predetermined overtones of the two sounded notes, one of these beat notes being the intended beat note for the particular two notes which are sounded, a tuning method comprising the steps of:

receiving from the two notes being sounded their fundamental tones, overtones and beat notes produced by the overtones, and producing an electrical signal representative thereof;

filtering the electrical signal to pass essentially only the intended beat note produced by predetermined overtones of the associated two sounded notes, and to exclude the fundamentals, other overtones and spurious beat notes produced by the sounded notes, and provide a filter output signal representative of essentially only the intended beat note; and producing in response to the filter output signal the sound of essentially only the intended beat note for audible reception to permit adjustment of the rate of the intended beat note and thereby adjust the note being tuned.

* * * * *

UNITED STATES PATENT AND TRADEMARK OFFICE

CERTIFICATE OF CORRECTION

PATENT NO. : 4,253,374

DATED : March 3, 1981

INVENTOR(S) : Peter C. Waterman

It is certified that error appears in the above-identified patent and that said Letters Patent are hereby corrected as shown below:

On the title page, Item [76]
"Peter C. Watterman" should read --Peter C. Waterman--;

Column 1, line 42, "aids and" should read --aids are--;

Column 4, line 61, "is one" should read --in one--.

Signed and Sealed this

*Eighth* Day of *September 1981*

[SEAL]

*Attest:*

GERALD J. MOSSINGHOFF

*Attesting Officer* *Commissioner of Patents and Trademarks*